United States Patent [19]

Stewart et al.

[11] Patent Number: 4,812,847
[45] Date of Patent: Mar. 14, 1989

[54] PARALLEL PORT PASS-THROUGH DIGITAL TO ANALOG CONVERTER

[76] Inventors: John L. Stewart, 3430 Bardell Ave., Eugene, Oreg. 97401; Bradley C. Stewart, 292 N. Grand, Eugene, Oreg. 97402

[21] Appl. No.: 104,196

[22] Filed: Oct. 2, 1987

[51] Int. Cl.⁴ .............................................. H03M 1/78
[52] U.S. Cl. .................................... 341/154; 341/144; 455/31
[58] Field of Search ................... 340/347 DA, 347 M; 341/126, 133, 144, 153, 154, 155, 159; 455/31, 38, 69, 132, 133, 140; 370/80; 375/8

[56] References Cited

U.S. PATENT DOCUMENTS 4,009,346  2/1977  Parker et al. ........................... 375/8

OTHER PUBLICATIONS

The Engineering Staff of Analog Devices, Inc., Analog-Digital Conversion Handbook, 6/1972, pp. II-36 to II-39.

*Primary Examiner*—William M. Shoop, Jr.
*Assistant Examiner*—Brian K. Young
*Attorney, Agent, or Firm*—Chernoff, Vilhauer, McClung & Stenzel

[57] ABSTRACT

A digital-to-analog (D/A) converter for connecting to a computer's parallel port, while allowing another peripheral to be attached to, and use, the same port. The D/A converter requires no external power supply. The D/A converter may be used to produce speech, music or other sounds.

7 Claims, 5 Drawing Sheets

PARALLEL PORT PASS-THROUGH DIGITAL TO ANALOG CONVERTER

BACKGROUND OF THE INVENTION

The present invention pertains to the field of digital-to-analog (D/A) converters. A D/A converter may be used with a personal computer to produce speech, music and other sounds.

In the past, a D/A converter had to be installed within a computer or connected to a computer's input-/output (I/O) port. When installed within the computer, at least partial disassembly of the computer was required. This disassembly was done by either a technician or an experienced computer user; novice computer users were intimidated by the apparent complexity.

When connected to an I/O port of the personal computer, the D/A converter prevented other peripherals from using the same port. Either another port was added, or the cables connecting the peripherals to the I/O port were manually switched.

Furthermore, since many I/O ports do not provide power to peripheral devices, external D/A converters generally required a separate power supply.

SUMMARY OF THE INVENTION

A parallel printer port comprises 8 binary data lines capable of jointly outputting one byte. The data lines are latched from one output byte to the next. The parallel port also comprises two other lines, a strobe line and a ground. Parallel ports may further comprise other signal wires, but the ten just described are always present.

In normal operation, the 8 binary data lines are latched individually to either ground or a positive voltage, representing the logic values 0 or 1. The active-low strobe line is then pulsed from its normal positive voltage to ground, commanding the printer to accept the data on the 8 binary data lines.

In most computers, programs can access the parallel port directly. In this manner, the 8 binary data lines may be latched to predetermined values without the strobe line being pulsed. By placing data on the 8 binary data lines at timed intervals, the output voltage from the D/A converter can drive a speaker to produce sound.

The digital data may be the result of sampled speech or computer calculations. Text-to-speech algorithms or sound synthesis algorithms may be used.

An audio signal, such as speech, is converted to a digital number when its waveform is sampled. Sampling must be done at a rate twice the highest frequency component of interest. For speech, a sample rate of 8 kilohertz provides high quality. However, lower rates, down to 4 kilohertz and even lower, can serve in some applications. Digital samples retain the magnitude value at each sampling instant. For an 8-bit analog-to-digital converter, the number of distinct amplitude levels is 256, including zero.

The sequence of 8-bit samples can be stored in a computer's main memory and transferred to and from mass storage devices. The original analog waveform, or a modified version thereof, can be recovered by sending individual 8-bit numbers to an output port, to which an 8-bit D/A converter is attached. The output port in turn sends signals to an audio amplifier and loudspeaker or radio transmitter or other device. Because each successive 8-bit number is latched, the final analog signal has a stepped appearance. In order to maintain original speech rate, output samples must occur at the same rate at which they were recorded, although computations can affect this. The output waveform can display up to 256 distinct levels, including zero.

The present invention is directed to a D/A converter that easily attaches to a personal computer's parallel printer port. It allows a printer to be attached concurrently to the same port. Digital signals then may be sent to either the D/A converter or the printer. The D/A converter is preferably contained in a case similar to that of a parallel port gender changer. The difference is the present invention's output connector is of the same gender as the computer's connector to which the input connector is attached.

Wires directly connect the corresponding pins of the input and output connectors, allowing all signals to pass through. The input impedance of the D/A converter is high enough to prevent excessive loading of the signals. Thus, a printer attached to the output connector will operate normally.

The audio signal can be connected to an audio amplifier and speaker of almost any type: a hi-fi amplifier, a paging or public address amplifier, earphones, a radio transmitter, a small portable amplifier and speaker, or to the audio amplifier that may be present in the video display unit used with the computer.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
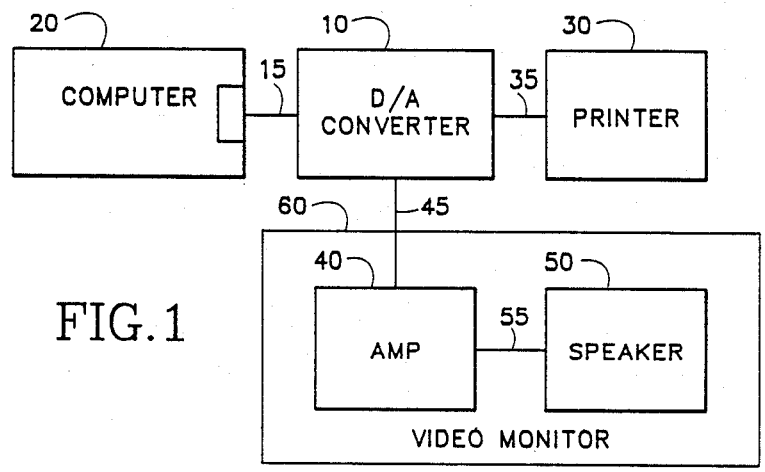
FIG. 1 is a block diagram of a D/A converter used in a system with a computer printer, amplifier and speaker.
Figure 2:
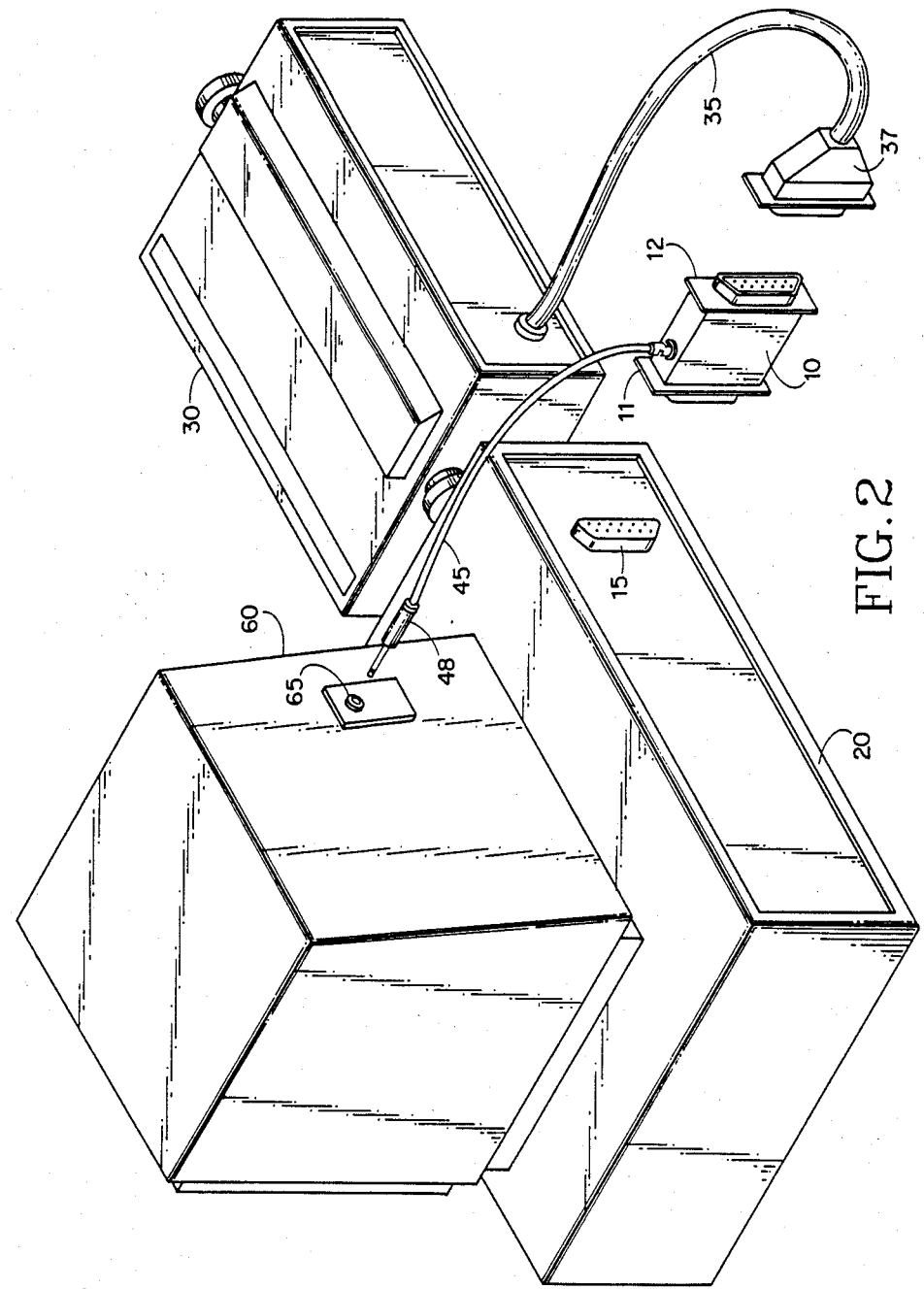
FIG. 2 is an exploded perspective drawing of a D/A converter used in a system with a computer, printer, and video monitor including an amplifier and speaker.

Referring to FIG. 1 and FIG. 2, a D/A converter 10 is connected to a parallel port 15 of a computer 20. A printer 30 is connected to the D/A converter via a parallel printer cable 35. The computer 20 may send data to the D/A converter 10 or data to the printer 30 without a change in the connections. The D/A converter 10 sends an analog output signal to an amplifier through an audio cable 45. The amplifier 40 then sends an amplified analog signal to a speaker 50 via a speaker wire 55. The amplifier 40, speaker wire 55, and speaker 50 may be included, as conventional, within a video monitor 60 used with the computer 20.

As seen in FIG. 2, the entire D/A converter 10 is contained within a DB-25 extension connector with an input connector 11 and an output connector 12. This allows the D/A converter 10 to connect directly to the parallel printer port 15. Preferably, output connector 12 has the same configuration as the parallel port 15. This allows the D/A converter to connect in series between the parallel port 15 and the printer cable connector 37. Wires directly connect the corresponding contacts of the input connector 11 and the output connector 12, allowing all signals to pass through the device. Thus, printer 30 connected to the output port 12 of the D/A converter 10 will operate normally.

The audio cable 45 preferably has a plug 48 for ease of connection to a audio jack 65 of a monitor 60. The plug 48 may also be used to connect to an external amplifier or tape recorder.

Many current computers have parallel printer ports using two-state integrated circuit (IC) devices. The data lines are latched low or high when a number is sent to the port, maintaining the last value until sent another.

Other computers have printer ports using open collector integrated circuit devices, which require external pull-up resistors for proper operation. Some computers with open collector devices contain the necessary pull-up resistors. Others depend on the peripheral device to provide them.

Proper operation results even when pull-up resistors in the peripheral supplement similar resistors in the computer, or when the computer uses two-state IC devices. Thus, most printers are supplied with pull-up resistors, allowing the printers to work with both two-state and open collector output devices.

Figure 3:
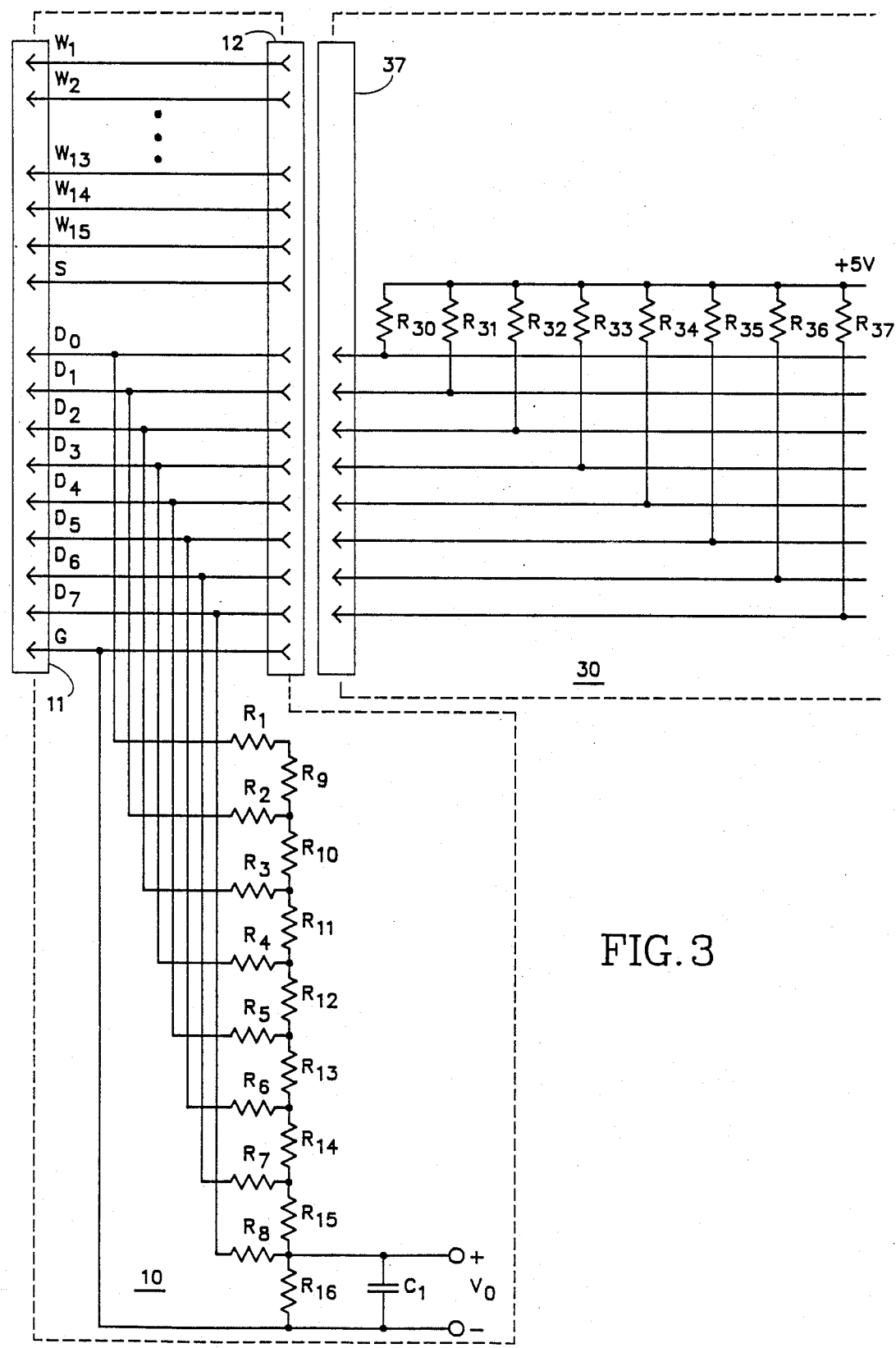
FIG. 3 is a schematic diagram of one embodiment of a D/A converter using a passive R-2R network connected to a printer having pull-up resistors.

The D/A converter of FIG. 3 will work correctly with computers having two-state outputs. If open-collector IC devices are used, either the computer must supply pull-up resistors or a powered-on printer which includes pull-up resistors must be attached to the output connector to ensure proper operation. The pull-up resistors in the printer should have resistances of approximately 4.7K ohms. FIG. 3 shows such a printer, having pull-up resistors $R_{30}$–$R_{37}$, attached to the output connector 12.

The R-2R resistor array $R_1$–$R_{16}$ is attached to the data lines $D_0$–$D_7$. The resistor array provides proper scaling of the digital outputs in ratios as 1, 2, 4, 8, 16, 32, 64, and 128 without requiring precision resistors. The resulting conversion to analog form can have the maximum accuracy possible with an 8-bit number, that is, one part out of 256. The capacitor $C_1$ acts as a filter to pass desired frequencies while attenuating the sampling frequency. Note that the output level $V_o$ can be constant or varying.

Nominal resistor values are 200K ohms each for resistors $R_1$ through $R_8$, 100K ohms for $R_9$ through $R_{15}$, and 15K ohms for $R_{16}$. The relatively high resistance values prevent undue loading of the data lines when data is being sent to the printer. Although smaller resistance values are suitable for computers with two-state outputs and would yield greater audio output voltages, the given resistance values will work with both two-state and open collector output devices. Capacitor $C_1$ has a value of about 0.005 microfarads, yielding a low-pass filter bandwidth of about 3000 hertz.

Wires $W_1$–$W_{15}$, S, $D_0$–$D_7$ and G directly connect the corresponding contacts of the input connector 11 and the output connector 12, allowing all signals to pass through the device.

Figure 4:
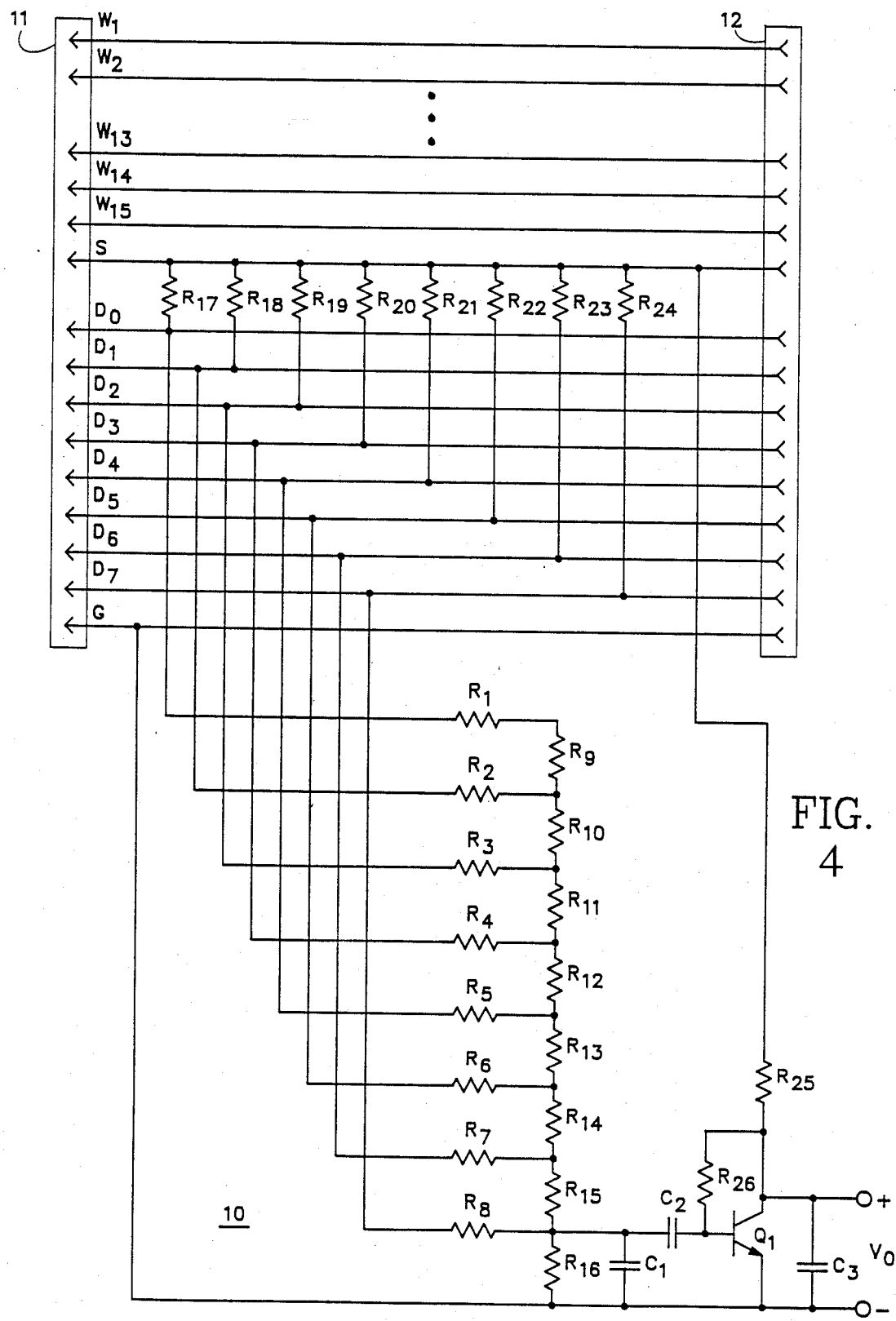
FIG. 4 is a schematic diagram of another embodiment of a D/A converter using a passive R-2R network and including pull-up resistors.

An alternative embodiment is shown in FIG. 4. As in the first described embodiment, wires $W_1$–$W_{15}$, S, $D_0$–$D_7$ and G directly connect the corresponding contacts of both connectors 11-12, allowing all signals to pass through the device.

To allow D/A converter to operate with parallel ports having open collector outputs, when neither the computer nor an attached printer supplies pull-up resistors, pull-up resistors $R_{17}$–$R_{29}$ are included. Since the parallel printer port 15 does not include a power signal line, a substitute signal line must be used. The active-low strobe line S was chosen since it is normally at a positive voltage. The strobe line will be pulsed low only when the computer 20 is commanding the printer 30 to accept data. Pull-up resistors $R_{17}$–$R_{24}$ have high resistances to prevent excessive loading of the strobe line S.

Nominal values for pull-up resistors $R_{17}$–$R_{29}$ are 100K ohms each. The values need not be precise. In this embodiment, the resistors $R_1$–$R_8$ and $R_9$–$R_{15}$ must be increased to 2 and 1 megohms, respectively, to prevent excessive loading of the pull-up resistors $R_{17}$–$R_{24}$. Although some inaccuracies can arise, they do not appear to be a problem for speech and music. With the load resistor $R_{16}$ maintained at 15K ohms, output level with a high resistance R-2R network will be considerably lower than with lower resistance levels—by about 20 decibels in the specific instances cited here.

Transistor $Q_1$ in cooperation with resistors $R_{25}$–$R_{26}$ amplify the output voltage across load resistor $R_{16}$. This embodiment provides the opportunity to further attenuate sampling frequency components with a second filter capacitor $C_3$.

Figure 5:
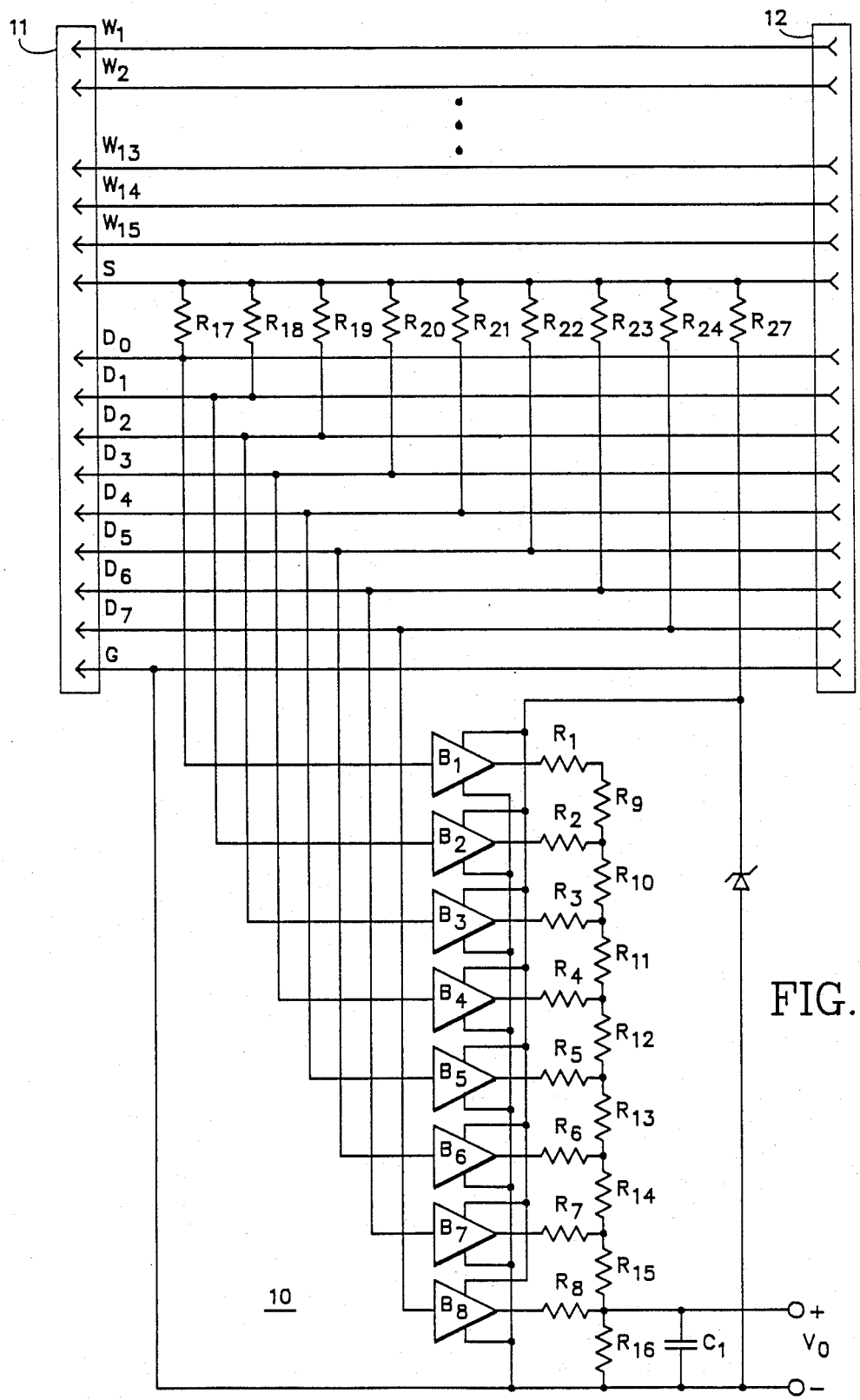
FIG. 5 is a schematic diagram of another embodiment of a D/A converter using active buffer amplifiers.

Still another embodiment is shown in FIG. 5. As in the first mentioned embodiment, wires $W_1$–$W_{15}$, S, $D_0$–$D_7$ and G directly connect the corresponding contacts of connectors 11 and 12, allowing all signals to pass through the device. The pull-up resistors $R_{17}$–$R_{24}$ are also present to allow the D/A converter to work with open collector printer ports.

In this embodiment, buffers $B_1$–$B_8$ are included. The buffers allow the option of signal inversion. Also, with two-input buffers, the analog output $V_o$ may be turned off or even modulated into a low frequency radio wave.

In order to maintain low power supply current requirements, CMOS buffers are most applicable. This allows the pull-up resistors $R_{17}$–$R_{24}$ to have high resistances, in the megohms. Resistance values in the R-2R network can be kept moderate without excessively loading the strobe power source S. This allows the output amplitudes to be as high as when the computer has two-state outputs and low value resistors are present.

In this embodiment, the power supply for the buffers $B_1$–$B_8$ is derived from the strobe signal line S, but is regulated by zener diode $Z_1$ in cooperation with resistor $R_{27}$. The regulated voltage is sufficiently lower than the unloaded signal line S—typically about 3.5 volts from a 5 volt strobe line S. This configuration allows maximal accuracy even in cases where the power supply in the computer is not maintained at a precise value. It will also produce a larger output voltage $V_o$ because the impedance level of the R-2R resistor array $R_1$–$R_{16}$ can be lower, but still high enough to limit drain on the strobe power source S.

All the above mentioned embodiments operate in the same manner. The standard printer port software routines are bypassed so that the port may be directly accessed. This allows the digital data to be placed on data lines $D_0$–$D_7$ without pulsing strobe line S low, thereby avoiding communicating with an attached printer 30. The data is sent to the data lines $D_0$–$D_7$ at predetermined intervals, resulting in a changing output voltage $V_o$ of the D/A converter. This voltage may be amplified and sent to a speaker 50.

When the computer 20 sends data to the printer 30 through the parallel printer port 15, the D/A converter 10 converts the data to corresponding voltage output level. The data rates may be slow such that the sound levels are not objectionable. Of course, the gain of the amplifier 40 may be decreased so no sound is heard.

The invention as described, pertains to the use of the 8 data lines of the printer port for creating an analog voltage with 256 levels, including zero. It will be recognized that the 8 bits can be interpreted in different ways, with somewhat different resistor array connections while retaining the basic features of the invention, i.e., external connection of the A/D device to the computer, without requiring a separate power supply and without interfering with normal printer operation in cases when the printer is attached.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A digital-to-analog converter device adapted for connecting to a parallel printer port of a personal computer having a plurality of binary data lines, a ground line, and an active-negative strobe line, while allowing said parallel printer port to communicate with a printer, said converter device comprising:
    (a) an input port connector having a multiplicity of input contacts, a plurality of said input contacts being adapted to receive binary data from said parallel printer port data lines, with a first of said input contacts being adapted to receive a signal from said active-negative strobe line, and a second of said input contacts being adapted to receive a ground signal from said parallel printer port ground line;
    (b) an output port connector having output contacts corresponding to said input contacts;
    (c) a plurality of signal wires directly connecting said input contacts to said corresponding output contacts; and
    (d) a conversion network means electrically connected to said input contacts for receiving binary data therefrom and for converting said binary data to analog voltage signals, said conversion network means having a sufficiently high input impedance such that said parallel printer port may operatively communicate with a printer connected to said output port connector.

2. The digital-to-analog converter device of claim 1 wherein said conversion network means comprises an R-2R resistive ladder network.

3. A device adapted to be coupled to a parallel printer port of a personal computer for outputting analog signals, yet allowing a printer coupled thereto to operate in a conventional manner on printer data and control signals output from said personal computer via said port, said device comprising:
    (a) an input connector adapted to attach said device to said parallel printer port;
    (b) first and second output connectors;
    (c) means for allowing printer data and control signals received by said input connector from said parallel printer port to pass through said device to said first output connector, thereby allowing said printer to receive said printer data and control signals; and
    (d) a digital-to-analog converter network electrically coupled to said input connector, wherein said converter network receives digital sound signals representing speech, music, or the like from said parallel printer port, converts said signals to analog signals and provides said analog sound signals to said second output connector.

4. The device of claim 3, further comprising an extension connector body enclosing the balance of said device.

5. The digital-to-analog converter device of claim 3 wherein said passive network comprises an R-2R resistive ladder network.

6. A device adapted to be connected between a parallel printer port of a personal computer, said output port having a plurality of output data lines, and an input port of a printer, comprising:
    (a) an input port connector being adapted to connect to said printer port and having a multiplicity of input contacts, a plurality of said input contacts being adapted to receive signals from said printer port output data lines;
    (b) an output port connector adapted to connect to a printer and having output contacts corresponding to said input contacts;
    (c) a plurality of signal wires connecting said input contacts to said corresponding output contacts such that signals received by said input contacts of said input port connector are available at said output contacts of said output port connector; and
    (d) conversion network means, electrically connected to said input contacts and adapted to receive binary data signals therefrom, for converting said binary data signals into analog audio signals, said conversion network means having a sufficiently high input impedance such that said parallel printer port may operatively communicate with a printer connected to said output port connector, whereby said personal computer may, via said printer port and said device, both transmit printer data signals and control signals to said printer and also transmit binary audio data signals, which said conversion network means receive and converts into corresponding analog audio signals, for coupling to an external audio reproducing means.

7. The device of claim 6, further characterized in that said printer port of said personal computer to which said device is adapted to be connected includes a strobe line, and said device further comprises a strobe input contact adapted to receive signals from said strobe line, a strobe output contact, and a strobe signal wire connecting said strobe input contact to said strobe output contact, whereby a signal on said strobe line generated by said personal computer is passed through said device and may be used to command said printer to read said data liners.

* * * * *

UNITED STATES PATENT AND TRADEMARK OFFICE
CERTIFICATE OF CORRECTION

PATENT NO. : 4,812,847

DATED : March 14, 1989

INVENTOR(S) : John L. Stewart, et al.

It is certified that error appears in the above-identified patent and that said Letters Patent is hereby corrected as shown below:

Col. 5, line 15      Change "A/D" to --D/A--

Col. 6, line 52      Change "receive" to --receives--

Signed and Sealed this

Eleventh Day of December, 1990

*Attest:*

HARRY F. MANBECK, JR.

*Attesting Officer*      *Commissioner of Patents and Trademarks*